(12) United States Patent
Steigerwald et al.

(10) Patent No.: US 8,441,097 B2
(45) Date of Patent: May 14, 2013

(54) METHODS TO FORM MEMORY DEVICES HAVING A CAPACITOR WITH A RECESSED ELECTRODE

(75) Inventors: Joseph M. Steigerwald, Forest Grove, OR (US); Nick Lindert, Beaverton, OR (US); Steven J. Keating, Beaverton, OR (US); Christopher J. Jezewski, Hillsboro, OR (US); Timothy E. Glassman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 525 days.

(21) Appl. No.: 12/646,957

(22) Filed: Dec. 23, 2009

(65) Prior Publication Data

US 2011/0147888 A1    Jun. 23, 2011

(51) Int. Cl.
*H01L 21/02*    (2006.01)
(52) U.S. Cl.
USPC ........... 257/532; 257/301; 257/303; 257/306; 257/E21.012; 257/E21.648; 257/E21.651; 257/E27.092; 438/239; 438/243; 438/253; 438/386; 438/396
(58) Field of Classification Search .................. 257/301, 257/E27.048, E27.092, E29.343, E29.346, 257/E21.396, E21.651, 303, 306, 532, E21.012, 257/E21.648; 438/243–244, 239–240, 386–387, 438/396, 253, 673, 713
See application file for complete search history.

(56) References Cited

U.S. PATENT DOCUMENTS

| | | | |
|---|---|---|---|
| 5,783,282 A * | 7/1998 | Leiphart | 428/138 |
| 6,002,149 A | 12/1999 | Dennison et al. | |
| 6,362,012 B1 * | 3/2002 | Chi et al. | 438/3 |
| 6,436,787 B1 | 8/2002 | Shih et al. | |
| 6,670,237 B1 | 12/2003 | Loh et al. | |
| 6,750,495 B1 * | 6/2004 | Alers et al. | 257/296 |
| 7,224,014 B2 | 5/2007 | Ichimura | |
| 7,927,959 B2 | 4/2011 | Keating et al. | |
| 7,981,756 B2 | 7/2011 | Lindert et al. | |

(Continued)

FOREIGN PATENT DOCUMENTS

KR    10-2005-0006017    1/2005

OTHER PUBLICATIONS

International Search Report for PCT/US2010/057253 dated Jun. 30, 2011, 3 pages. (P30294PCT).

(Continued)

*Primary Examiner* — Matthew Reames
*Assistant Examiner* — Ermias Woldegeorgis
(74) *Attorney, Agent, or Firm* — Blakely, Sokoloff, Taylor & Zafman LLP

(57) ABSTRACT

Methods to form memory devices having a MIM capacitor with a recessed electrode are described. In one embodiment, a method of forming a MIM capacitor with a recessed electrode includes forming an excavated feature defined by a lower portion that forms a bottom and an upper portion that forms sidewalls of the excavated feature. The method includes depositing a lower electrode layer in the feature, depositing an electrically insulating layer on the lower electrode layer, and depositing an upper electrode layer on the electrically insulating layer to form the MIM capacitor. The method includes removing an upper portion of the MIM capacitor to expose an upper surface of the electrode layers and then selectively etching one of the electrode layers to recess one of the electrode layers. This recess isolates the electrodes from each other and reduces the likelihood of a current leakage path between the electrodes.

12 Claims, 5 Drawing Sheets

U.S. PATENT DOCUMENTS

| | | |
|---|---|---|
| 2003/0102522 A1 | 6/2003 | Lee |
| 2004/0152255 A1 | 8/2004 | Seidl et al. |
| 2005/0009346 A1 | 1/2005 | Miyajima |
| 2005/0082586 A1 | 4/2005 | Tu |
| 2005/0106809 A1 | 5/2005 | Shea |
| 2007/0212845 A1 | 9/2007 | Lin et al. |
| 2007/0275536 A1* | 11/2007 | Cremer et al. ................ 438/381 |
| 2008/0239618 A1 | 10/2008 | Cremer et al. |
| 2009/0191686 A1 | 7/2009 | Wang et al. |
| 2010/0079924 A1 | 4/2010 | Keating et al. |
| 2010/0155887 A1 | 6/2010 | Lindert et al. |

OTHER PUBLICATIONS

International Search Report for PCT/US2009/058540 dated Apr. 23, 2010, 3 pages. (P27523PCT).

International Preliminary Report on Patentability for PCT/US2010/057253, mailed Jul. 5, 2012, 6 pages.

* cited by examiner

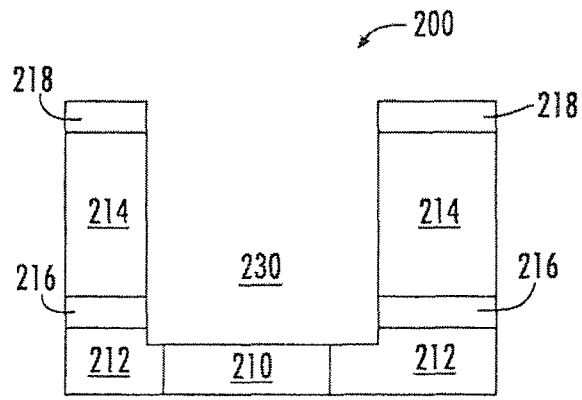
FIG. 2
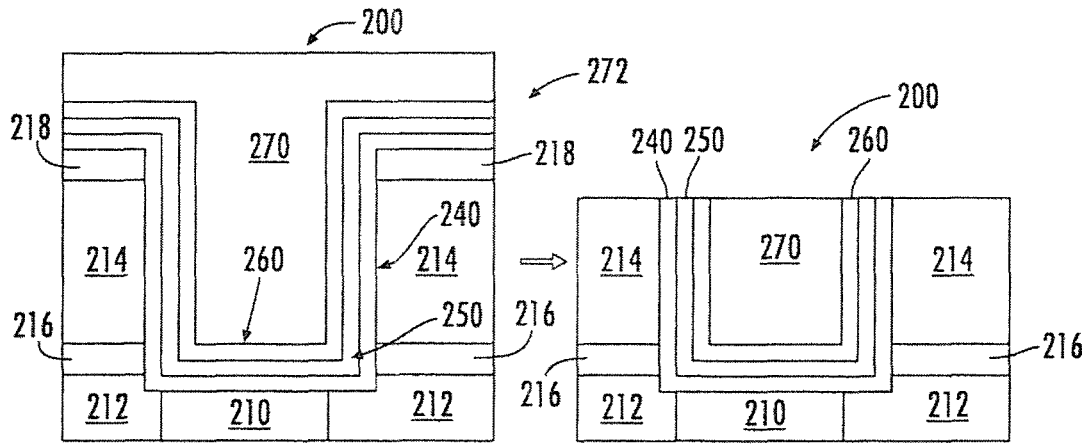
FIG. 3A
FIG. 3B
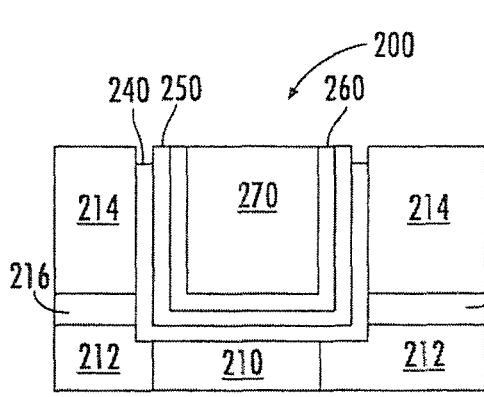
FIG. 3C
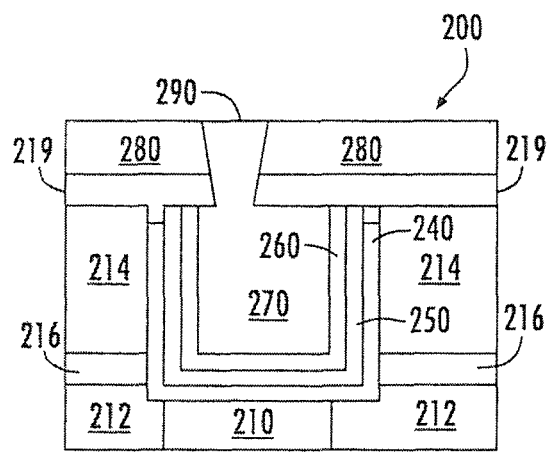
FIG. 3D

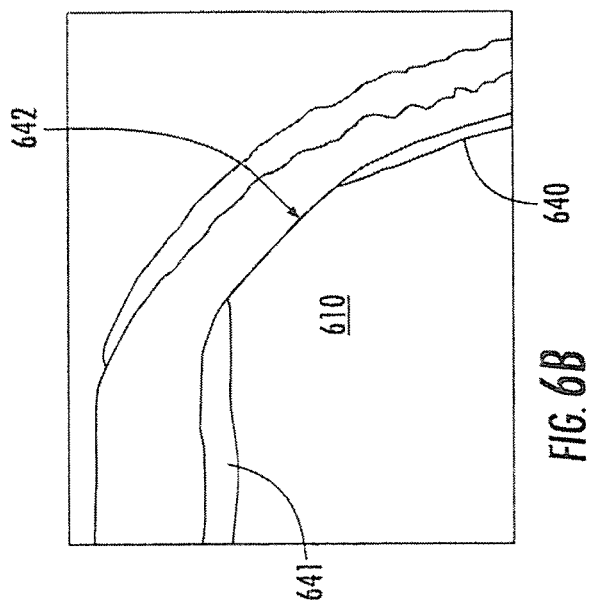
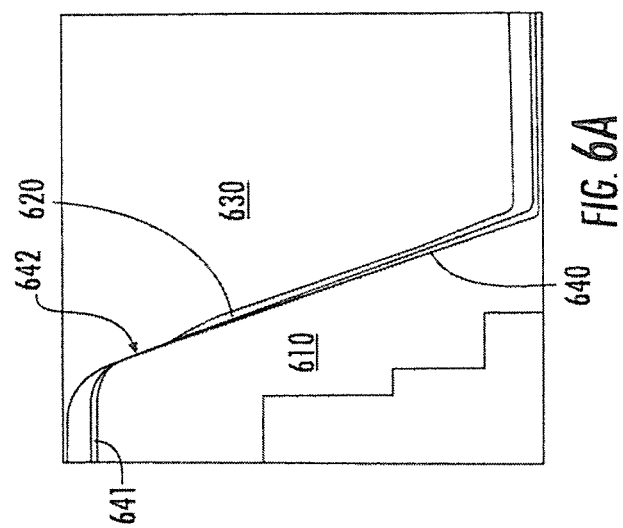
FIG. 6A
FIG. 6B

METHODS TO FORM MEMORY DEVICES HAVING A CAPACITOR WITH A RECESSED ELECTRODE

FIELD OF THE PRESENT DISCLOSURE

The disclosed embodiments of the present disclosure relate generally to metal-insulator-metal (MIM) capacitors, and relate more particularly to techniques suitable for manufacturing such capacitors in embedded technologies.

BACKGROUND OF THE PRESENT DISCLOSURE

Memory access time is a significant factor affecting the performance of computer systems. System performance can typically be enhanced by placing the memory on the same die or in the same package as the processor, and embedded dynamic random access memory (embedded DRAM, or eDRAM) is an example of such on-die or on-package memory technology. Because capacitors are the data storage element of eDRAM, the fabrication of eDRAM involves the manufacture of embedded capacitors—a process that includes subtractive metal patterning. Traditionally, subtractive metal patterning has been done with numerous processing operations including plasma etching. Plasma etches are highly anisotropic, making it very difficult to cleanly remove metal from a surface oriented orthogonally to the wafer surface and plasma field.

BRIEF DESCRIPTION OF THE DRAWINGS

Embodiments of the present invention are illustrated by way of example, and not by way of limitation, in the figures of the accompanying drawings and in which:

FIG. 2 is a cross-sectional view of an excavated feature 230 of an embedded memory device 200, such as an eDRAM or the like, according to an embodiment of the present disclosure.

FIG. 3A is a cross-sectional view of a MIM capacitor 272 formed in the excavated feature 230 of the embedded memory device 200, according to an embodiment of the present disclosure.

FIG. 3B is a cross-sectional view of embedded memory device 200 at a different particular point in its manufacturing process according to an embodiment of the present disclosure.

FIG. 3C is a cross-sectional view of embedded memory device 200 after a selective etch recesses a conductive electrode layer of the MIM capacitor according to an embodiment of the present disclosure.

FIG. 3D is a cross-sectional view of embedded memory device 200 after formation of a via to the MIM capacitor according to an embodiment of the present disclosure.

FIG. 6A is a cross-sectional view of a portion of an excavated feature 630 after deposition of a lower electrode layer on the feature according to an embodiment of the present disclosure.

FIG. 6B is an exploded view of the beveled region 642 according to an embodiment of the present disclosure.

DETAILED DESCRIPTION OF THE DRAWINGS

Figure 1:
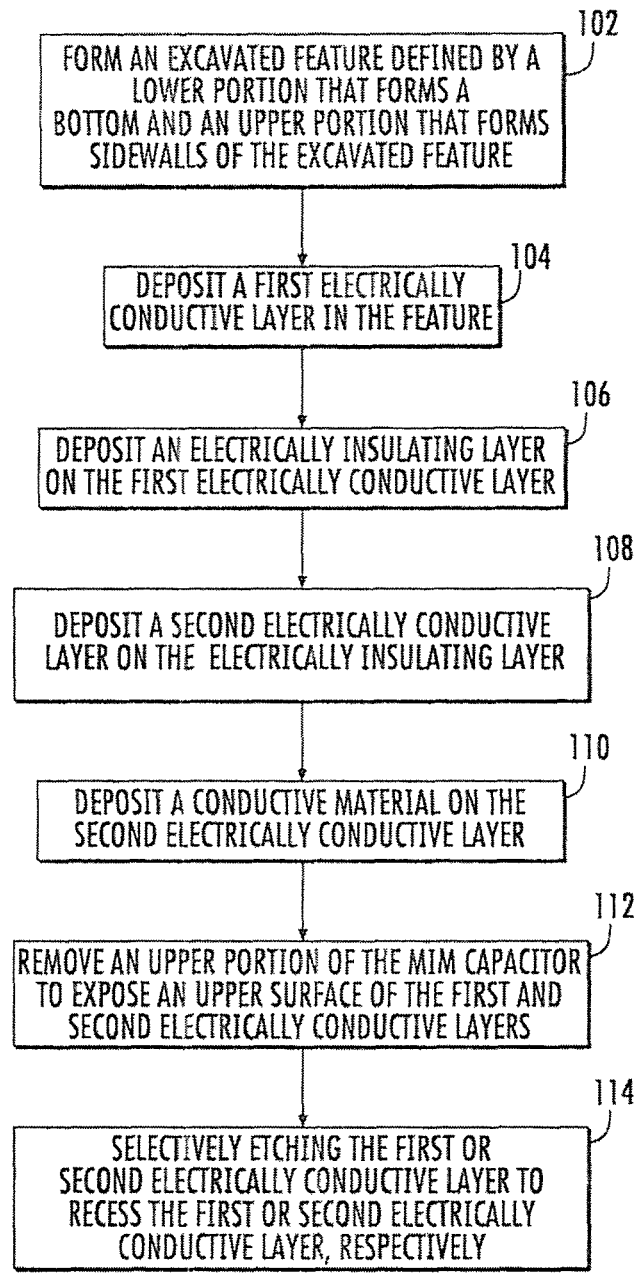
FIG. 1 is a flowchart illustrating a method 100 of forming an embedded MIM capacitor having a recessed electrode according to an embodiment of the present disclosure.

In one embodiment of the present disclosure, a method of forming a MIM capacitor with a recessed electrode includes forming an excavated feature defined by a lower portion that forms a bottom of the excavated feature and an upper portion that forms sidewalls of the excavated feature. The method includes depositing a lower electrode layer in the feature, depositing an electrically insulating layer on the lower electrode layer, and depositing an upper electrode layer on the electrically insulating layer to form the MIM capacitor. The method includes removing an upper portion of the MIM capacitor to expose an upper surface of the electrode layers and then selectively etching one of the electrode layers to recess one of the electrode layers. This recess isolates the electrodes from each other and reduces the likelihood of a current leakage path between the electrodes. The described method may be used to produce a MIM capacitor suitable for an eDRAM device.

In certain embodiments, a method of fabricating a MIM capacitor includes forming an excavated feature defined by a lower portion that forms a bottom and an upper portion that forms sidewalls of the excavated feature. A first electrically conductive layer is then deposited on the excavated feature with a resputter ratio that causes beveling of upper corners of the excavated feature in order to form a recessed lower electrode layer within the excavated feature. Next, the method includes depositing an electrically insulating layer on the first electrically conductive layer and depositing a second electrically conductive layer (e.g., upper electrode) on the first electrically insulating layer. At least a portion of the beveled upper corners of the excavated feature includes no first electrical conductive layer. This technique performs selective deposition by sputtering high energy metal or Argon ions to provide isolation between the capacitor electrodes.

It was mentioned above that eDRAM capacitors are manufactured using a subtractive metal patterning process. Traditionally, subtractive metal patterning has been done by plasma etching. Plasma etches are highly anisotropic, making it very difficult to cleanly remove metal from a surface oriented orthogonally to the wafer surface and plasma field. Additionally, subtractive metal patterning requires a large number of processing operations. One approach deposits a lower electrode layer in a dielectric feature, fills the feature with a spin-on film, plasma etches a top portion of the film, wet etches an exposed portion of the lower electrode layer, removes the film, deposits a dielectric layer, deposits the upper electrode, and then planarizes the MIM capacitor. This approach suffers from pattern-dependent lower electrode height variation, which causes significant capacitance variation for the MIM capacitor.

Embodiments of the present disclosure overcome these problems by using selective etch techniques and chemicals to recess one of the electrodes after the planarization of the MIM capacitor, thus enabling the efficient manufacture of eDRAM capacitors. Other embodiments of the present disclosure overcome these problems by using a selective deposition of the lower electrode to form a recessed lower electrode. The recessed electrode techniques of the present disclosure require fewer process operations, do not suffer from pattern-dependent electrode height, and do not have to account for polish variation when determining how to recess one of the electrodes. The reduced electrode height variation provides a higher recessed electrode height, which provides more capacitance.

The recessed electrode techniques of the present disclosure provide a sequential deposition of a lower electrode layer, high-k dielectric layer, and upper electrode layer without intervening wet processing operations. As used herein, the phrase "high-k" refers to materials having a dielectric constant, k, greater than that of silicon dioxide, that is, greater than about 4. In an embodiment, a selective etch recesses one of the electrodes after planarization of the MIM capacitor. A subsequent filling of an electrode recess with a CVD dielectric provides robust isolation between upper and lower electrodes. The resulting capacitor has fewer defects and higher surface area, resulting in a better yield and performance, respectively.

FIG. 1 is a flowchart illustrating a method 100 of forming an embedded MIM capacitor according to an embodiment of the present disclosure. As an example, method 100 may result in the formation of a structure in which an embedded memory device may be constructed. The method 100 includes forming an excavated feature defined by a lower portion that forms a bottom and an upper portion that forms sidewalls of the excavated feature at block 102. In one embodiment, the upper portion includes dielectric material (e.g., sidewalls of the feature) and the lower portion includes an electrically conductive layer that at least partially defines the bottom of the feature at block 102. Next, the method 100 includes depositing a first electrically conductive layer in the feature at block 104. Then, the method 100 includes depositing an electrically insulating layer on the first electrically conductive layer at block 106. The method 100 further includes depositing a second electrically conductive layer on the electrically insulating layer at block 108. Then, a conductive material is deposited on the second electrically conductive layer at block 110. The conductive material fills the feature.

In one embodiment, the first electrically conductive layer forms a bottom electrode of the capacitor. The second electrically conductive layer and conductive material in combination form a top electrode of the capacitor. Then, an upper portion of the MIM capacitor is removed to expose an upper surface of the first and second electrically conductive layers at block 112. In one embodiment, the upper portion of the capacitor is removed using standard semiconductor processing operations such as etching. For example, a chemical-mechanical planarization (CMP) process or plasma etch process may perform the etch. The etch may be stopped upon reaching an upper portion of the dielectric material. The method 100 further includes selectively etching the first or second electrically conductive layer to recess the first or second electrically conductive layer, respectively at block 114.

In an embodiment, the selective etch includes a selective wet etch that recesses the first electrically conductive layer (e.g., bottom electrode) without substantially etching exposed portions of the electrically insulating layer nor the second electrically conductive layer (e.g., top electrode). In another embodiment, the selective wet etch recesses the second electrically conductive layer without substantially etching exposed portions of the electrically insulating layer nor the first electrically conductive layer.

FIG. 2 is a cross-sectional view of an excavated feature 230 of an embedded memory device 200, such as an eDRAM or the like, according to an embodiment of the present disclosure. As illustrated in FIG. 2A, embedded memory device 200 comprises an electrically conductive layer 210, an electrically insulating layer 212, an electrically insulating layer 214, and etch stop layers 216 and 218. An excavated feature 230 is an opening or recess defined by a lower portion (e.g., 210, 212) and an upper portion (e.g., 214, 216, 218).

FIG. 3A is a cross-sectional view of a MIM capacitor 272 formed in the excavated feature 230 of the embedded memory device 200, according to an embodiment of the present disclosure. The MIM capacitor 272 includes an electrically conductive layer 240 located in excavated feature 230 adjacent to and electrically connected to electrically conductive layer 210, an electrically insulating layer 250 located in excavated feature 230 deposited on electrically conductive layer 240, and an electrically conductive layer 260 located in excavated feature 230 and deposited on electrically insulating layer 250. The MIM capacitor 272 may also include a conductive material 270 deposited on the layer 260. The material 270 fills a recess of the MIM capacitor 272. In one embodiment, the layers 240 and 260 may be formed of Tantalum (Ta), Tantalum Nitride (TaN), or Titanium Nitride (TiN) using sputter, physical vapor deposition (PVD), or atomic layer deposition (ALD) processing.

As an example, electrically conductive layer 210 can be a metal line made of copper or the like. As another example, electrically conductive layer 270 can be a plug made of copper or another metal. In one embodiment, the metal of electrically conductive layer 210 and the metal of electrically conductive layer 270 are the same (e.g., copper). As another example, etch stop layers can be a CVD dielectric (e.g., Silicon Carbide (SiC)). As another example, electrically insulating layer 250 can be a conformal dielectric film, which in one embodiment comprises a high-k metal oxide or other high-k material. The layer 250 may be formed of Hafnium Oxide (HfO2), Zirconium Oxide (ZrO2), Tantalum Oxide (Ta2O5), Barium Strontium Titanate (e.g., BaSrTiO3), Aluminum Oxide (Al2O3), or combinations of these materials (e.g., ZrO2/Al2O3/ZrO2) using ALD or other semiconductor processing technology.

FIG. 3B is a cross-sectional view of embedded memory device 200 at a different particular point in its manufacturing process according to an embodiment of the present disclosure. As illustrated in FIG. 3B, an upper portion of capacitor 272 has been removed such that the remaining device is planarized. In one embodiment, the portion of the capacitor 272 that is removed is etched away using a plasma etch or CMP operation or a combination of these operations. The etch may be stopped upon reaching an upper portion of the dielectric layer 214. At this point in the process, the electrode layers 240 and 260 are merely separated by the thickness of the dielectric layer 250. In order to ensure that a current leakage path is not created across the top of the dielectric layer 250, the present design of the embedded memory device increases the distance between the electrode layers 240 and 260 by recessing one of the electrode layers 240 or 260.

FIG. 3C is a cross-sectional view of embedded memory device 200 after a selective etch recesses a conductive electrode layer 240 of the MIM capacitor according to an embodiment of the present disclosure. The selective etch can selectively etch the electrically conductive layer 240 or layer 260 to recess one of these layers. In an embodiment, the selective etch includes a selective wet etch that recesses the electrically conductive layer 240 (e.g., bottom or lower electrode) without substantially etching exposed portions of the electrically insulating layer 250 nor the electrically conductive layer 260 (e.g., top or upper electrode). For this embodiment, the layer 240 may include TiN and the layer 260 may include Ta or TaN.

In another embodiment, the selective wet etch recesses the layer 260 without substantially etching exposed portions of the electrically insulating layer 250 nor the layer 240. For this embodiment, the layer 260 may include TiN and the layer 240 may include Ta or TaN.

In some embodiments, the selective wet etch includes hydrogen peroxide chemistries (acidic or alkali) in order to etch titanium alloys and ceramics with high selectivity against etching of high-k dielectrics and copper. In one embodiment, the selective wet etch includes approximately 15% weight hydrogen peroxide with pH adjusted to approximately 8 at a temperature of approximately 50 C. This etch chemistry etches TiN with greater than 40:1 selectivity to HfO2, Ta, TaN, Cu, and interlayer dielectric layer (e.g., 214). The amount of electrode removed varies dependent on a given capacitor application. This amount of removed electrode can vary from 10-20 Angstroms (A) up to 500-600A or possibly a greater amount.

FIG. 3D is a cross-sectional view of embedded memory device 200 after formation of a via to the MIM capacitor according to an embodiment of the present disclosure. An etchstop layer 219 and interlayer dielectric layer 280 have been deposited on the device. The via connection 290 to the upper electrode (e.g., material 270 and layer 260) is patterned, etched, and filled. These operations can be accomplished using conventional via patterning techniques.

Figure 4:
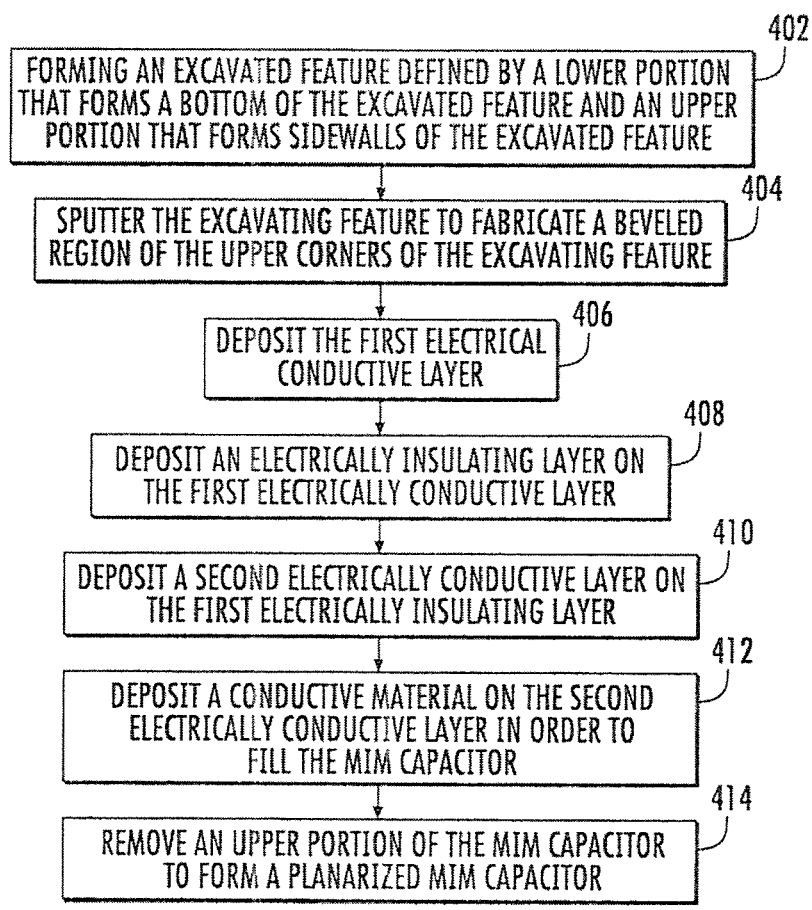
FIG. 4 is a flowchart illustrating a method 400 of forming a MIM capacitor having a recessed electrode according to another embodiment of the present disclosure.

In certain embodiments, a MIM capacitor having a recessed electrode can be formed with a selective deposition of the recessed electrode. FIG. 4 is a flowchart illustrating a method 400 of forming a MIM capacitor with a recessed electrode according to an embodiment of the present disclosure. As an example, method 400 may result in the formation of a structure in which an embedded memory device may be constructed. The method 400 includes forming an excavated feature defined by a lower portion that forms a bottom of the excavated feature and an upper portion that forms sidewalls of the excavated feature at block 402. The method optionally includes a sputtering operation to fabricate a beveled region of the upper corners of the excavating feature at block 404. This sputtering operation is optionally performed prior to the deposition of the first electrical conductive layer, which occurs at block 406. The first electrically conductive layer is deposited with a resputter ratio that causes beveling of upper corners of the excavated feature in order to form a recessed lower electrode layer within the excavated feature at block 406. At least a portion of the beveled upper corners of the excavated feature includes no first electrical conductive layer as described in more detail below and illustrated in FIGS. 5A-5D. If operation 404 is performed, then operation 406 may be more effective in selectively depositing the first electrically conductive layer on the lower portion (e.g., bottom) and the upper portion (e.g., sidewalls) of the excavated feature that is below the beveled region, which is completely or at least partially without the first conductive layer.

The method 400 includes depositing an electrically insulating layer on the first electrically conductive layer at block 408. The method 400 includes depositing a second electrically conductive layer on the first electrically insulating layer at block 410. The method 400 includes depositing a conductive material on the second electrically conductive layer in order to fill the MIM capacitor at block 412. The method 400 includes removing an upper portion of the MIM capacitor to form a planarized MIM capacitor at block 414. The planarized MIM capacitor has the lower electrode layer recessed with respect to an upper electrode layer formed of the remaining second electrically conductive layer and conductive material.

Figures 5A, 5B:
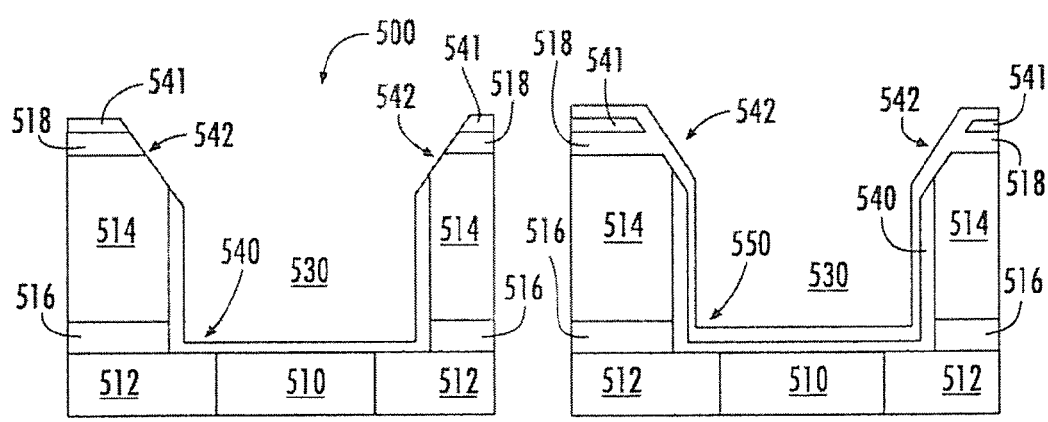
FIG. 5A is a cross-sectional view of an excavated feature 530 of an embedded memory device 500, such as an eDRAM or the like, according to an embodiment of the present disclosure.
FIG. 5B is a cross-sectional view of the formation of a MIM capacitor in the excavated feature 530 of the embedded memory device 500, according to an embodiment of the present disclosure.

FIG. 5A is a cross-sectional view of an excavated feature 530 of an embedded memory device 500, such as an eDRAM or the like, according to an embodiment of the present disclosure. As illustrated in FIG. 5A, embedded memory device 500 comprises an electrically conductive layer 510, an electrically insulating layer 512, an electrically insulating layer 514, and etch stop layers 516 and 518. An excavated feature 530 is an opening or recess defined by a lower portion (e.g., 510, 512) and an upper portion (e.g., 514, 516, 518). A metal-insulator-metal (MIM) capacitor is deposited on the excavated feature 530 as illustrated in FIGS. 5A-5D. FIG. 5A illustrates a first electrically conductive layer (e.g., 540, 541) deposited with a resputter ratio that causes beveling of upper corners (e.g., beveled regions 542) of the excavated feature 530. The first electrically conductive layer includes an upper portion 541 and a lower portion 540 that is a recessed lower electrode layer of a MIM capacitor deposited on the excavated feature. At least a portion of the beveled regions 542 of the excavated feature includes no first electrical conductive layer. The upper portion 541 and lower portion 540 are separated and electrically insulated from each other. In an embodiment, the resputter ratio is greater than 1. In another embodiment, the resputter ratio is approximately 1.4 to 1.6.

FIG. 5B is a cross-sectional view of the formation of a MIM capacitor in the excavated feature 530 of the embedded memory device 500 in a different point of fabrication, according to an embodiment of the present disclosure. An electrically insulating layer 550 is deposited on the electrically conductive layer (e.g., 540, 541).

Figures 5C, 5D:
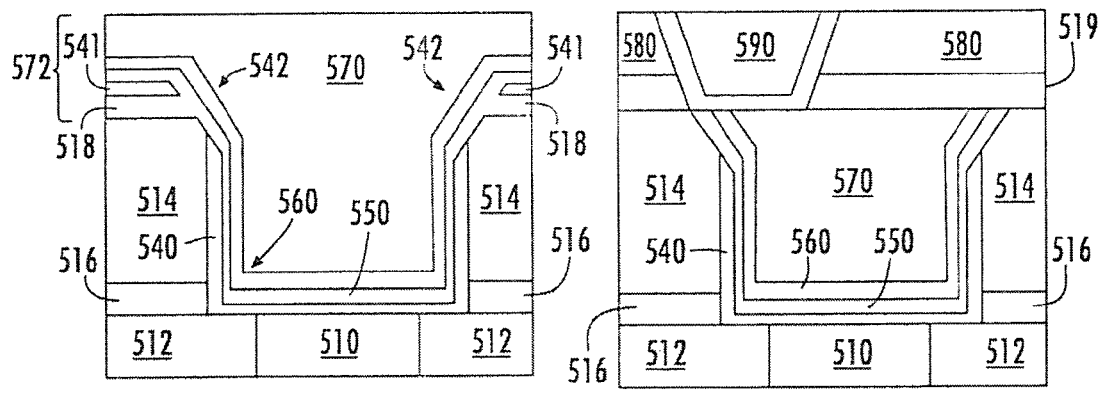
FIG. 5C is a cross-sectional view of the formation of a MIM capacitor in the excavated feature 530 of the embedded memory device 500 in a different point of fabrication, according to an embodiment of the present disclosure.
FIG. 5D is a cross-sectional view of the formation of a MIM capacitor in the excavated feature 530 of the embedded memory device 500 in a different point of fabrication, according to an embodiment of the present disclosure.

FIG. 5C is a cross-sectional view of the formation of a MIM capacitor 572 in the excavated feature 530 of the embedded memory device 500 in a different point of fabrication, according to an embodiment of the present disclosure. An electrically conductive layer 560 is deposited on the electrically insulating layer 550. A conductive material 570 fills the MIM capacitor 572. The MIM capacitor 572 includes the lower electrode 540, insulating layer 550, conductive layer 560 (e.g., upper electrode), and material 570.

In an embodiment, upper corners of the excavating feature 530 include a beveled region 542 that is caused by a sputtering operation (e.g., metal ions, Argon). This sputter operation can be performed prior to the deposition of the electrical conductive layer (e.g., 540, 541).

FIG. 5D is a cross-sectional view of the formation of a MIM capacitor 572 in the excavated feature 530 of the embedded memory device 500 in a different point of fabrication, according to an embodiment of the present disclosure. FIG. 5D illustrates the removal of an upper portion of the MIM capacitor 572 to form a planarized MIM capacitor having the lower electrode layer 540 recessed with respect to an upper electrode layer 560 formed of the remaining second electrically conductive layer. In one embodiment, the conductive layer (e.g., 540, 541) may be formed of Ta, TaN, Ti, or TiN using a sputter processing. The layer 560 may be formed of Ta, TaN, Ti, or TiN using sputter, physical vapor deposition (PVD), or atomic layer deposition (ALD) processing.

In some embodiments, the bottom electrode 540 can be recessed during the deposition process by the following processes alone or in combination.

1. deposit Ti, Ta, TiN, or TaN by using sputtering to bevel the top corners of the excavated feature 530 prior to and/or during the bottom electrode metal deposition. Deposition is done in a regime where there is a "net etch" at the top corners. The "net etch" condition results in the bottom plate being recessed.

2. flaring out the etch during the capacitor patterning, so that sputtering is more effective at depositing the electrode metal on the bottom and sidewalls while leaving the top corners metal free.

In one specific embodiment, one such stack and etch combination is as follows. The bottom electrode plate 540 is formed with Ta with a high resputter rate. The PVD High-k dielectric includes HfO2 using ALD processing. The top electrode includes Ta (or TaN) using sputter, PVD, or ALD deposition. The conductive material 570 is formed with copper.

As an example, electrically conductive layer 510 can be a metal line made of copper or the like. As another example, electrically conductive layer 570 can be a plug made of copper or another metal. In one embodiment, the metal of electrically conductive layer 510 and the metal of electrically conductive layer 570 are the same (as in the case where both are copper). As another example, etch stop layers can be a CVD dielectric (e.g., SiC). As another example, electrically insulating layer 550 can be a conformal dielectric film, which in one embodiment comprises a high-k metal oxide or other high-k material. The layer 550 may be formed of HfO2, ZrO2, Ta2O5, BaSrTiO3, Al2O3, or combinations of these materials (e.g., ZrO2/Al2O3/ZrO2) using ALD or other semiconductor processing technology.

As illustrated in FIG. 5D, an upper portion of capacitor 572 has been removed such that the remaining device is planarized. In one embodiment, the portion of the capacitor 572 that is removed is etched away using a plasma etch or CMP operation or a combination of these operations. The etch may be stopped upon reaching an upper portion of the dielectric layer 541. Next, an etchstop layer 519 and interlayer dielectric layer 580 have been deposited on the device. The via connection 590 to the upper electrode (e.g., material 570 and layer 560) is patterned, etched, and filled. These operations can be accomplished using conventional via patterning techniques.

FIG. 6A is a cross-sectional view of a portion of an excavated feature 630 after deposition of a lower electrode layer on the feature according to an embodiment of the present disclosure. A dielectric region 610 forms a sidewall of the excavated feature 630 with a lower electrode layer 640 and upper conductive portion 641 being deposited on the excavated feature during a sputtering operation having a high resputtering ratio. A copper layer 620 is formed after the sputtering operation that depositions layer 640 and portion 641. The excavated feature 630 has a beveled region 642.

FIG. 6B is an exploded view of the beveled region 642 according to an embodiment of the present disclosure. The beveled region 642 does not contain lower electrode layer 640 nor upper conductive portion 641, which are selectively deposited with physical vapor deposition (PVD) on the dielectric region 610.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the present disclosure described herein are, for example, capable of operation in sequences other than those illustrated or otherwise described herein. Similarly, if a method is described herein as comprising a series of operations, the order of such operations as presented herein is not necessarily the only order in which such operations may be performed, and certain of the stated operations may possibly be omitted and/or certain other operations not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

Although the present disclosure has been described with reference to specific embodiments, it will be understood by those skilled in the art that various changes may be made without departing from the spirit or scope of the present disclosure. Accordingly, the disclosure of embodiments of the present disclosure is intended to be illustrative of the scope of the present disclosure and is not intended to be limiting. It is intended that the scope of the present disclosure shall be limited only to the extent required by the appended claims. For example, to one of ordinary skill in the art, it will be readily apparent that the embedded memory device and the related structures and methods discussed herein may be implemented in a variety of embodiments, and that the foregoing discussion of certain of these embodiments does not necessarily represent a complete description of all possible embodiments.

What is claimed is:

1. An embedded memory device comprising:
    an excavated feature defined by a lower portion that forms a bottom and an upper portion that forms sidewalls of the excavated feature and includes beveled regions; and
    a metal-insulator-metal (MIM) capacitor deposited on the excavated feature, the MIM capacitor comprising:
        a first electrically conductive layer with beveled upper corners, wherein an upper surface of the beveled upper corners of the first electrically conductive layer is planar with the beveled regions of the excavated feature.

2. The embedded memory device of claim 1, wherein the MIM capacitor further comprises:
    an electrically insulating layer deposited on the first electrically conductive layer; and
    a second electrically conductive layer deposited on the electrically insulating layer.

3. The embedded memory device of claim 1, wherein the first electrically conductive layer is deposited with a resputter ratio that causes beveling of beveled regions of the excavated feature in order to form a recessed lower electrode layer within the excavated feature, wherein the resputter ratio is approximately 1.4 to 1.6.

4. The embedded memory device of claim 1, wherein at least a portion of the upper surface of the beveled regions of the excavated feature comprises no first electrically conductive layer.

5. The embedded memory device of claim 1, wherein the beveled regions of the excavating feature are in the same plane as the upper surface of the beveled upper corners of the first electrically conductive layer.

6. The embedded memory device of claim 2, further comprising:
    a conductive material deposited on the second electrically conductive layer prior to the removal of an upper portion of the MIM capacitor to form a planarized MIM capacitor having the lower electrode layer recessed with respect to an upper electrode layer formed of the remaining second electrically conductive layer.

7. A method of fabricating a metal-insulator-metal (MIM) capacitor comprising:
   forming an excavated feature defined by a lower portion that forms a bottom and an upper portion that forms sidewalls of the excavated feature; and
   depositing a first electrically conductive layer with a resputter ratio that causes beveling of upper corners of the excavated feature and the first electrically conductive layer in order to form a recessed lower electrode layer within the excavated feature, wherein an upper surface of the beveled upper corners of the first electrically conductive layer is planar with a surface of the beveled upper corners of the excavated feature.

8. The method of claim 7, further comprising:
   depositing an electrically insulating layer on the first electrically conductive layer; and
   depositing a second electrically conductive layer on the electrically insulating layer.

9. The method of claim 7, wherein the resputter ratio is approximately 1.4 to 1.6.

10. The method of claim 7, wherein at least a portion of the upper surface of the beveled upper corners of the excavated feature comprises no first electrical conductive layer and is connected to and in the same plane as the upper surface of the beveled upper corners of the first electrically conductive layer.

11. The method of claim 7, further comprising:
    sputtering that is performed prior to the deposition of the first electrical conductive layer to fabricate a beveled region of the upper corners of the excavating feature.

12. The method of claim 8, further comprising:
    depositing a conductive material on the second electrically conductive layer; and
    removing an upper portion of the MIM capacitor to form a planarized MIM capacitor having the lower electrode layer recessed with respect to an upper electrode layer formed of the remaining second electrically conductive layer.

* * * * *